United States Patent
Lu et al.

(10) Patent No.: US 12,538,436 B2
(45) Date of Patent: Jan. 27, 2026

(54) SEMI-FLEX PRINTED CIRCUIT BOARD WITH COVER-OPENING OPENING

(71) Applicant: TRIPOD (WUXI) ELECTRONIC CO., LTD., WuXi (CN)

(72) Inventors: Cheng Ming Lu, WuXi (CN); Han-Ching Shih, WuXi (CN); Hsu Tu, WuXi (CN); Wen-Che Chen, WuXi (CN); Wu-Chiang Ma, WuXi (CN)

(73) Assignee: TRIPOD (WUXI) ELECTRONIC CO., LTD., WuXi (CN)

( * ) Notice: Subject to any disclaimer, the term of this patent is extended or adjusted under 35 U.S.C. 154(b) by 117 days.

(21) Appl. No.: 18/364,013

(22) Filed: Aug. 2, 2023

(65) Prior Publication Data

US 2024/0049401 A1   Feb. 8, 2024

(30) Foreign Application Priority Data

Aug. 3, 2022 (CN) .......................... 202210926097.3
Sep. 6, 2022 (CN) .......................... 202211081608.2

(51) Int. Cl.
*H05K 1/18* (2006.01)
*H05K 3/46* (2006.01)

(52) U.S. Cl.
CPC .......... *H05K 3/4691* (2013.01); *H05K 1/182* (2013.01)

(58) Field of Classification Search
CPC ........ H05K 1/0278; H05K 1/182; H05K 1/18; H05K 2201/09127; H05K 2203/0228;
(Continued)

(56) References Cited

U.S. PATENT DOCUMENTS 11,222,867 B1    1/2022  Huang et al.
2008/0043067 A1  2/2008  Nayve et al.
(Continued)

FOREIGN PATENT DOCUMENTS

KR   20070047219 A  *  5/2007  ............. H05K 3/429
WO      2008098270 A1    8/2008

OTHER PUBLICATIONS

Extended European Search Report for Application No. 23156098.8, dated Aug. 31, 2023, 8 Pages.
(Continued)

*Primary Examiner* — Timothy J Thompson
*Assistant Examiner* — Guillermo J Egoavil
(74) *Attorney, Agent, or Firm* — BROOKS KUSHMAN P.C.

(57) ABSTRACT

A semi-flex printed circuit board with cover-opening opening is disclosed. An inner side of the core substrate surrounds a cover-opening opening. The two metal dam structures are arranged on a side surface of the core substrate; and the two metal dam structures and the core substrate jointly surround the cover-opening opening. The core board is arranged on a side surface of the bonding sheet away from the core substrate. Two sides of a bottom of the core substrate surrounding the cover-opening opening are provided with two laser cutting sidewalls respectively. Sidewalls of the two metal dam structures surrounding the cover-opening opening are connected with the two laser cutting sidewalls respectively and each defined as a metal dam sidewall. An obtuse angle presents between the metal dam sidewall and the laser cutting sidewall.

9 Claims, 6 Drawing Sheets

(58) Field of Classification Search
CPC ....... H05K 2203/107; H05K 2203/308; H05K 3/4691; H05K 3/4697; H05K 3/46
USPC ........................................................ 174/254
See application file for complete search history.

(56) References Cited

U.S. PATENT DOCUMENTS

| | | |
|---|---|---|
| 2018/0200992 A1 | 7/2018 | Schonholz |
| 2020/0043855 A1 | 2/2020 | Lu et al. |
| 2021/0045249 A1* | 2/2021 | Tuominen .............. H05K 1/118 |
| 2022/0039259 A1 | 2/2022 | Xin et al. |
| 2023/0230849 A1 | 7/2023 | Cheng et al. |

OTHER PUBLICATIONS

USPTO Office Action in U.S. Appl. No. 18/363,921 dated Sep. 8, 2025 (27 pages).

* cited by examiner

SEMI-FLEX PRINTED CIRCUIT BOARD WITH COVER-OPENING OPENING

CROSS-REFERENCE TO RELATED APPLICATIONS

This application claims foreign priority benefits under 35 U.S.C. § 119(a)-(d) to Chinese patent application number CN 202210926097.3, filed Aug. 3, 2022, and Chinese patent application number CN 202211081608.2, filed on Sep. 6, 2022, each of which is hereby incorporated by reference herein in its entirety.

TECHNICAL FIELD

The present disclosure relates to a printed circuit board, in particular to a semi-flex printed circuit board with a cover-opening opening.

BACKGROUND

In an existing manufacturing process for a circuit board, strippable glue may be mixed with PP glue at an edge of a cover-opening opening after a cover-opening operation, which results in difficulty in stripping off the strippable glue when cleaning. Moreover, in the existing art, an angle of an edge of the cover-opening opening is affected by laser, which causes medicine liquid exchanging problem, resulting in a long stripping off time for the strippable glue; also, there is a risk that the strippable glue may be remained, which may affect electrical characteristics of finished circuit boards. That is, in the existing art, the printed circuit board with cover-opening opening may involve the problem of poorer reliability due to residual glue.

Therefore, how to provide a semi-flex printed circuit board with cover-opening opening to overcome the above-mentioned defects has become one of the important issues to be solved in this industry.

SUMMARY

The technical problem to be solved by the present disclosure is to provide a semi-flex printed circuit board with a cover-opening opening to overcome the shortcomings of the existing art.

In order to solve the above technical problems, one of the technical solutions adopted by the present disclosure is to provide a semi-flex printed circuit board with cover-opening opening, including: a core substrate with an inner side surrounding an cover-opening opening, the cover-opening opening penetrating through two side surfaces of the core substrate at opposite sides; two metal dam structures arranged on one of the two side surfaces of the core substrate and surrounding the cover-opening opening together with the core substrate; a bonding sheet attached to the side surface of the core substrate with the two metal dam structures provided thereon, a part of the bonding sheet being exposed to the cover-opening opening and surrounding the cover-opening opening together with the core substrate; and a core board arranged on a side surface of the bonding sheet away from the core substrate; wherein two sides of a bottom of the core substrate surrounding the cover-opening opening are provided with two laser cutting sidewalls respectively, and sidewalls of the two metal dam structures surrounding the cover-opening opening are connected with the two laser cutting sidewalls respectively and each defined as metal dam sidewall; wherein in relation to each of the metal dam sidewalls and the laser cutting sidewall connected thereto, an included angle between the metal dam sidewall and the laser cutting sidewall is 120 degrees to 150 degrees.

The present disclosure is beneficial effects in that, the semi-flex printed circuit board with cover-opening opening provided by the present disclosure can solve the problem that the strippable printing ink is difficult to be stripped off, and can reduce the possibility of residue of strippable printing ink, thereby improving the reliability of the printed circuit board, by adopting the technical solution of "a core substrate with an inner side surrounding an cover-opening opening, the cover-opening opening penetrating through two side surfaces of the core substrate at opposite sides; two metal dam structures arranged on one of the two side surfaces of the core substrate and surrounding the cover-opening opening together with the core substrate; a bonding sheet attached to the side surface of the core substrate with the two metal dam structures provided thereon, a part of the bonding sheet being exposed to the cover-opening opening and surrounding the cover-opening opening together with the core substrate; and a core board arranged on a side surface of the bonding sheet away from the core substrate; wherein two sides of a bottom of the core substrate surrounding the cover-opening opening are provided with two laser cutting sidewalls respectively, and sidewalls of the two metal dam structures surrounding the cover-opening opening are connected with the two laser cutting sidewalls respectively and each defined as metal dam sidewall; wherein in relation to each of the metal dam sidewalls and the laser cutting sidewall connected thereto, an included angle between the metal dam sidewall and the laser cutting sidewall is 120 degrees to 150 degrees".

For better understanding of the features and technical contents of the present disclosure, reference may be made to the following detailed description and drawings related to the present disclosure. However, the drawings as provided are only for reference and explanation but not intended to limit the present disclosure.

EXPLANATIONS OF SIGNS

Figure 1:
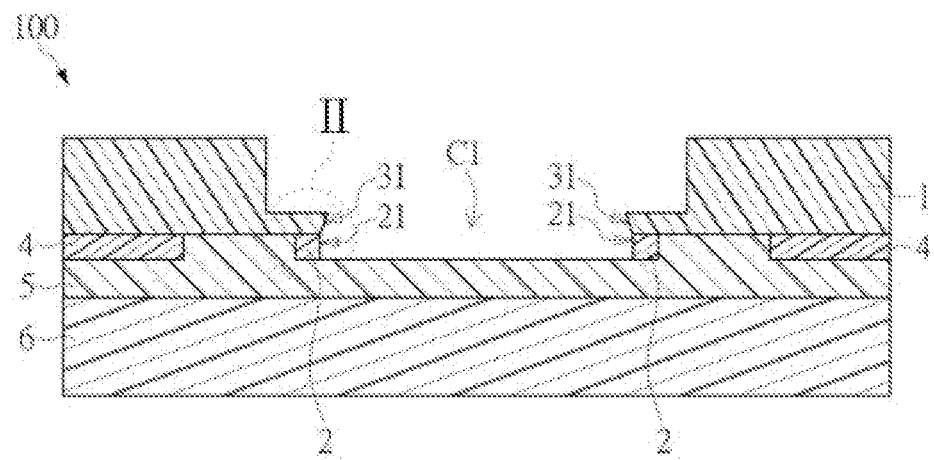
FIG. 1 is a schematic diagram of a semi-flex printed circuit board according to an embodiment of the present disclosure.

100: printed circuit board
1: core substrate
2: metal dam structure
21: metal dam sidewall
3: laser cut groove
31: laser cutting sidewall
4: metal circuit pattern
5: bonding sheet
6: core board
M: metal coating layer
R: printing area
B: bending area
E: electronic component
W: width
H: height
I: strippable printing ink
I1: residual ink
F: blind routing milling cutter
F1: blind routing opening
C: cover-opening structure
C1: cover-opening opening
α: included angle.

DETAILED DESCRIPTION

The following are specific embodiments to illustrate the implementations of the present disclosure, and those skilled in the art can understand the advantages and effects of the present disclosure from the disclosure of this specification. The present disclosure can be implemented or applied by other different specific embodiments, and various details in this specification can be modified and changed based on different viewpoints and applications without departing from the concept of the present disclosure. In addition, the drawings of the present disclosure are only simple and schematic illustrations but not drawn according to actual dimensions which are declared in advance. The following embodiments will further explain the related technical contents of the present disclosure in detail, but the disclosed contents are not intended to limit the scope of protection of the present disclosure.

It should be understood that although terms such as "first", "second" and "third" may be used herein to describe various elements or signals, these elements or signals should not be limited by these terms. These terms are mainly used to distinguish one element from another, or one signal from another. In addition, the term "or" used herein should possibly include any one or a combination of more of the associated, listed items according to the actual situation.

Referring to FIGS. 1 to 4, an embodiment of the present disclosure provides a semi-flex printed circuit board 100 with cover-opening opening. The semi-flex printed circuit board 100 includes a core substrate 1, two metal dam structures 2, a metal circuit pattern 4, a bonding sheet 5 and a core board 6.

An inner side of the core substrate 1 surrounds a cover-opening opening C1, and the cover-opening opening C1 penetrates through two side surfaces of the core substrate 1 at opposite sides (such as an upper surface and a lower surface of the core substrate 1 in FIG. 1). The two metal dam structures 2 and the metal circuit pattern 4 are formed on one side surface of the core substrate 1 (as shown in FIG. 1, the lower surface of the core substrate 1); and the two metal dam structures 2 and the core substrate 1 jointly surround the cover-opening opening C1. In the present embodiment, the metal circuit pattern 4 is located at an outer side of the two metal dam structures 2, and there is a gap between the metal circuit pattern 4 and the metal dam structures 2, but the present disclosure is not limited thereto.

The bonding sheet 5 is attached to the side surface of the core substrate 1 with the two metal dam structures 2 and the metal circuit patterns 4 provided thereon; a part of the bonding sheet 5 located at the inner side of the two metal dam structures 2 is exposed to the cover-opening opening C1, so that this part and the core substrate 1 jointly surround the cover-opening opening C1. That is, the inner side of the core substrate 1, the two metal dam structures 2, and the part of the bonding sheet 5 exposed to the cover-opening opening C1 jointly surround and define the cover-opening opening C1.

The core board 6 is arranged on a side surface of the bonding sheet 5 away from the core substrate 1 (such as the lower surface of the bonding sheet 5 in FIG. 1).

In the present embodiment, two sides of a bottom of the core substrate 1 surrounding the cover-opening opening C1 have two laser cutting sidewalls 31 respectively; sidewalls of the two metal dam structures 2 surrounding the cover-opening opening C1 are connected with the two laser cutting sidewalls 31 respectively and each defined as a metal dam sidewall 21.

Figure 2:
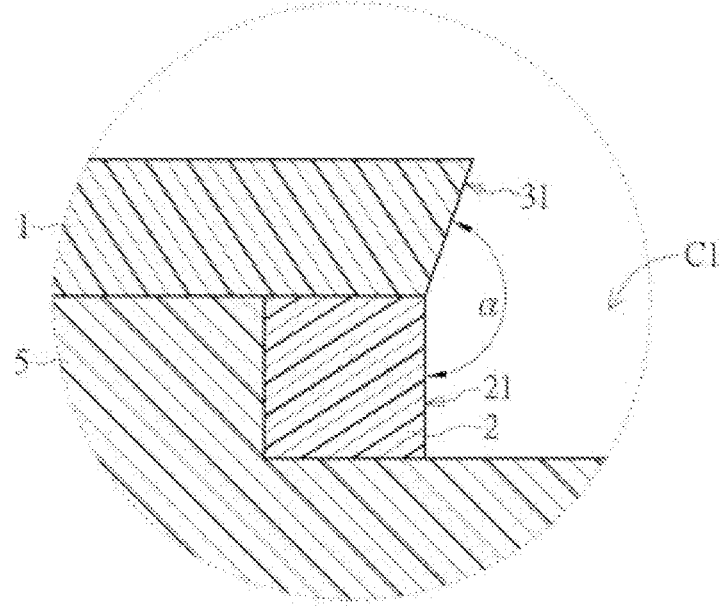
FIG. 2 is a partially enlarged schematic view of area II in FIG. 1.

As shown in FIG. 2, in relation to each of the metal dam sidewalls 21 and the laser cutting sidewall 31 connected thereto, an included angle α between the metal dam sidewall 21 and the laser cutting sidewall 31 is 120 degrees to 150 degrees, and preferably 130 degrees to 140 degrees.

As shown in FIG. 2, an area with the included angle α between the metal dam sidewall 21 and the laser cutting sidewall 31 is defined as a flushing space, in which chemical medicine liquid can be provided for flushing in a cover-opening operation, so that no residual glue of strippable printing ink remains in the flushing space.

That is, in the existing art, after a cover-opening operation in the manufacturing process of the circuit board, the strippable glue at the edge of the cover-opening opening may be mixed with PP glue and hence is difficult to be stripped off when cleaning, and the medicine liquid is difficult to be exchanged and hence easily results in residual glue. However, such problems can be effectively solved by the present disclosure, and the reliability of the printed circuit board can be improved.

Figure 5A:
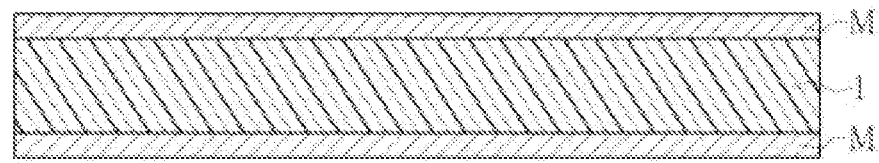
FIG. 5A is a schematic diagram of step S110 of a cover-opening method of a printed circuit board according to an embodiment of the present disclosure.
Figure 5B:
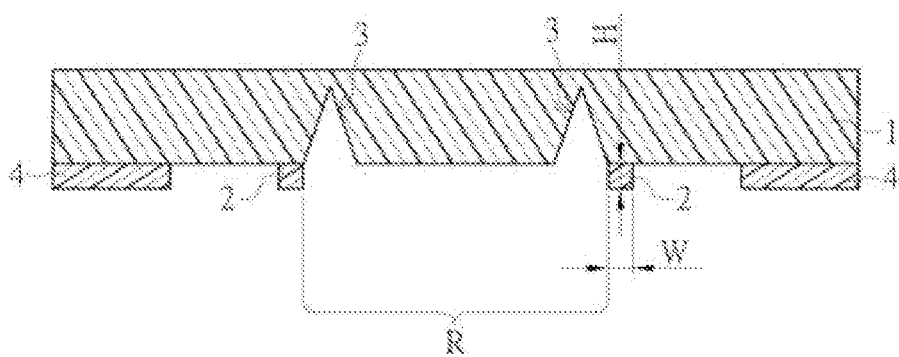
FIG. 5B is a schematic diagram of step S120 of the cover-opening method of the printed circuit board according to the embodiment of the present disclosure.

Each of the metal dam structures 2 has a substantially rectangular (as shown in FIG. 2) or trapezoidal (not shown in the figures) shape; a width W of each of the metal dam structures 2 is between 30 microns and 600 microns, and a height H of each of the metal dam structures 2 is between 15 microns and 300 microns (please referring to FIG. 5B together).

Still referring to FIG. 1, the cover-opening opening C1 is substantially in a shape with a wider top and a narrower bottom (for example, a shape of inverted Chinese character "凸", with a wider top and a narrower bottom); and the two metal dam sidewalls 21 and the two laser cutting sidewalls 31 jointly define a narrower part of the cover-opening opening C1.

Figure 3:
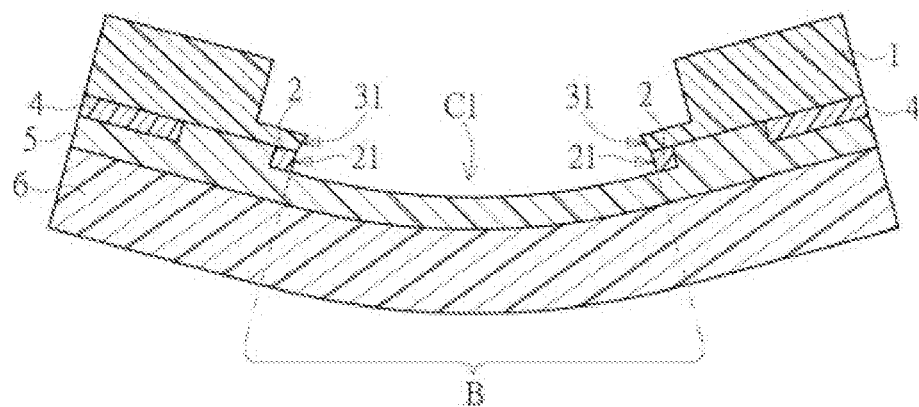
FIG. 3 is a schematic diagram illustrating a semi-flex state of the semi-flex printed circuit board in FIG. 1.

As shown in FIG. 3, in an embodiment of the present disclosure, a section of the printed circuit board 100 located at the cover-opening opening C1 is defined as a semi-flex section B, and the printed circuit board 100 can be bent from the semi-flex section B.

Figure 4:
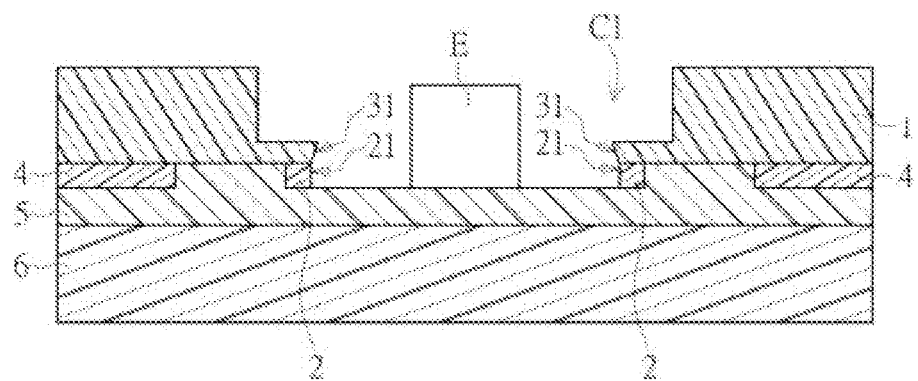
FIG. 4 is a schematic diagram illustrating an electronic component embedded in the semi-flex printed circuit board of FIG. 1.

As shown in FIG. 4, in an embodiment of the present disclosure, the printed circuit board 100 further includes an electronic component E embedded in the cover-opening opening C1; and the electronic component E can be, for example, a resistor or a capacitor.

Still referring to FIG. 1, a side surface of the bonding sheet 5 is attached to the two metal dam structures 2 and the metal circuit pattern 4 on the core substrate 1, and is further trapped in the gap between the inner sides of the two metal dam structures 2 and the metal circuit pattern 4, so as to be attached to the side surface of the core substrate 1; and another side surface of the bonding sheet 5 is attached to the core board 6, so as to attached the core substrate 1 with the core board 6.

Furthermore, the metal dam sidewalls 21 of the two metal dam structures 2 face towards the cover-opening opening C1 without attached with the bonding sheet 5 (that is, the metal dam sidewalls 21 are not directly in contact with the bonding sheet 5); and the metal dam sidewalls 21 of the two metal dam structures 2 are substantially perpendicular to the bonding sheet 5. For example, an included angle between the metal dam sidewall 21 and the bonding sheet 5 is between 80 degrees and 100 degrees.

In some embodiments of the present disclosure, the two metal dam structures 2 are formed by a metal etching operation, and the two laser cutting sidewalls 31 are formed by a laser cutting operation, but the present disclosure is not limited thereto.

The above is the description of the structural features of the semi-flex printed circuit board with cover-opening opening in the embodiment of the present disclosure, while a cover-opening method and related material features of the semi-flex printed circuit board in the embodiment of the present disclosure will be described below.

Referring to FIGS. 5A to 5G, an embodiment of the present disclosure provides a cover-opening method of semi-flexible printed circuit board, including steps S110, S120, S130, S140, S150, S160 and S170. It should be explained that the sequence and the actual operation mode of the steps in the present embodiment can be adjusted as required and are not limited to this embodiment.

The cover-opening method of semi-flexible printed circuit board of the embodiment of the present disclosure can provide additional operation(s) before, during or after respective steps, and some of the described operations can be replaced, eliminated or relocated so as to realize additional embodiments of the method. The cover-opening method of semi-flex printed circuit board will be described below with reference to FIGS. 1 to 5G.

FIG. 5A is a schematic diagram of the step S110 of the cover-opening method of semi-flex printed circuit board according to the embodiment of the present disclosure. The step S110 includes: providing a core substrate 1 (also referred to as a core), and both side surfaces of the core substrate 1 are provided with a metal covering layer M (e.g., metal copper foil).

FIG. 5B is a schematic diagram of the step S120 of the cover-opening method of semi-flex printed circuit board according to the embodiment of the present disclosure. The step S120 includes: performing a metal etching operation to form two convex metal dam structures 2 and a metal circuit pattern 4 on one side surface of the core substrate 1; and performing a laser cutting operation to form two laser cut grooves 3 recessed from the side surface of the core substrate 1.

Herein, inner sides of the two metal dam structures 2 surround and form a printing area R on the core substrate 1. The two laser cut grooves 3 are recessed from the side surface of the core substrate 1, the positions of the two laser cut grooves 3 are corresponding to the printing area R, and the two laser cut grooves 3 are formed at the inner sides of the two metal dam structures 2 respectively and are closely adjacent to the two metal dam structures 2. That is, the core substrate 1 is formed with one laser cut groove 3 at the inner side of each of the two metal dam structures 2, and the laser cut groove 3 is arranged closely adjacent to the metal dam structure 2. It is worth mentioning that the two metal dam structures 2 and the two laser cut grooves 3 in FIG. 2 are viewed from a cross section of the circuit board structure.

When viewed from a top view of the circuit board structure, the metal dam structures 2 can be, for example, two long strip dams to surround and form the printing area R, but the present disclosure is not limited thereto; the metal dam structures 2 can also be, for example, a continuous ring structure (not shown) to surround and form the printing area R. Any structural design of the metal dam structure 2 capable of surrounding and forming the printing area R conforms to the protection spirit of the present disclosure and belongs to the scope of protection of the present disclosure.

More specifically, the metal etching operation is to etch the metal covering layer M on the core substrate 1 (e.g., by wet etching or dry etching) to remove part of the metal covering layer M, so as to form the two convex metal dam structures 2 on the core substrate 1.

It is worth mentioning that, after part of the metal covering layer M is removed, a metal circuit pattern 4 is further formed on the core substrate 1; the metal circuit pattern is not located in the printing area R, but the present disclosure is not limited thereto. The metal circuit pattern 4 is configured to connect electronic components together and to provide the printed circuit board with required electrical characteristics. Furthermore, it is worth mentioning that, the metal dam structure 2 can be a structure with a barrier function only, but it can also be, for example, another metal circuit pattern with both the barrier function and the electrical connection function.

Moreover, in each of the metal dam structures 2, the material of the metal dam structure 2 is copper, and a cross section of the metal dam structure 2 is substantially rectangular (as shown in FIG. 2) or trapezoidal (not shown). A width W of the metal dam structure 2 is preferably between 30 microns and 600 microns, preferably between 30 microns and 175 microns, and particularly preferably between 50 microns and 155 microns. A height H of the metal dam structure 2 is between 15 microns and 300 microns, and preferably between 17.5 microns and 280 microns.

In the laser cutting operation, a laser cutting machine (such as a PCB laser cutting machine) is used to cut the core substrate 1 with laser to remove part of the material of the core substrate 1, so that the core substrate 1 can be formed with two concaved laser cut grooves 3. In the present embodiment, each of the laser cut grooves 3 is substantially V-shaped, but the present disclosure is not limited thereto. Moreover, the depth of each of the laser cut grooves 3 can be adjusted according to design requirements of products.

Figure 5C:
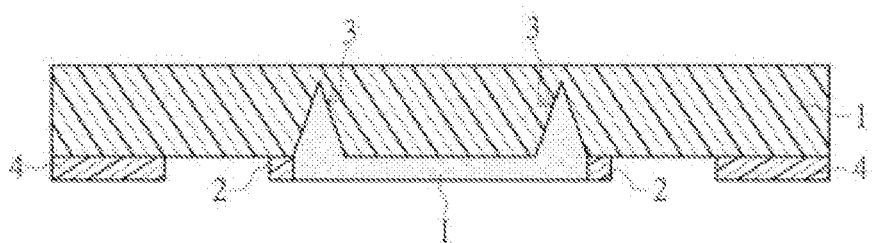
FIG. 5C is a schematic diagram of step S130 of the cover-opening method of the printed circuit board according to the embodiment of the present disclosure.

FIG. 5C is a schematic diagram of the step S130 of the cover-opening method of semi-flex printed circuit board according to the embodiment of the present disclosure. The step S130 includes: performing a printing operation to print a strippable printing ink I in the printing area R at the inner sides of the two metal dam structures 2 on the core substrate 1, and the strippable printing ink I can be further filled in the two laser cut grooves 3 during the printing operation.

In the cover-opening method of semi-flex printed circuit board according to the embodiment of the present disclosure, by means of the design of the metal dam structures 2 and the laser cut grooves 3, the occurrence of overflow of the strippable printing ink I in the printing process can be avoided, and the stripping efficiency and removing effect for the strippable printing ink I in the subsequent stripping operation can be assisted to improve.

More specifically, the metal dam structure 2 can prevent the strippable printing ink I from overflowing during the printing process; and the strippable printing ink I is filled in the laser cut grooves 3 during the printing process, which can also assist in preventing the strippable printing ink I from overflowing from the positions of the metal dam structures 2. Furthermore, the laser cut grooves 3 can assist in improving the stripping efficiency and removing effect to the strippable printing ink I in the subsequent stripping operation.

In connection to material types, the strippable printing ink I can be, for example, strippable ink, gold-finger protecting ink, electroplating-resistant ink, PI, PFG and the like which are commonly adopted for PCB, but is not limited to the materials that can assist in separation. Furthermore, the step S130 further includes: drying the strippable printing ink I in the shade or baking the strippable printing ink I so that the strippable printing ink I is in a cured state, so as to facilitate the subsequent stripping operation.

Figure 5D:
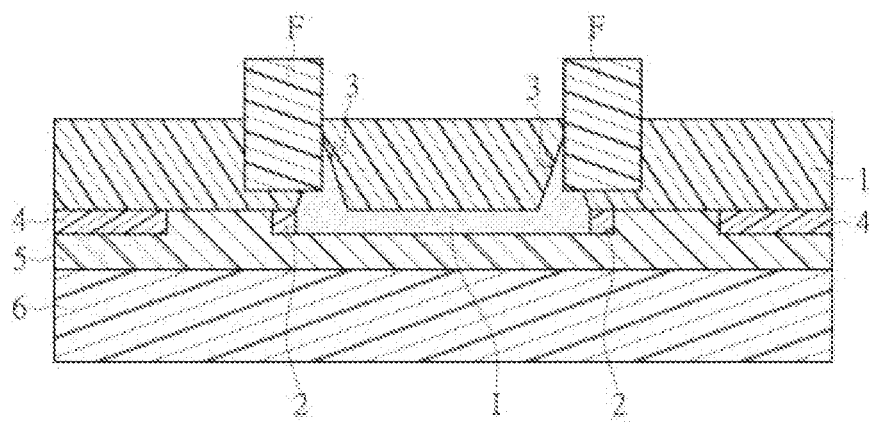
FIG. 5D is a schematic diagram of step S140 of the cover-opening method of the printed circuit board according to the embodiment of the present disclosure.

FIG. 5D is a schematic diagram of the step S140 of the cover-opening method of semi-flex printed circuit board according to the embodiment of the present disclosure. The step S140 includes: performing a lamination process to laminate a build-up board structure onto the side surface of the core substrate 1 provided with the metal dam structures 2; and performing a blind routing operation to blind route the other side surface of the core substrate 1 by using a blind routing machine.

The build-up board structure includes a bonding sheet 5 (such as PP glue, also referred to as a prepreg) and a core board 6 (such as another core). The bonding sheet 5 is attached between the core substrate 1 and the core board 6 to adhere the core substrate 1 with the core board 6.

More specifically, one side surface of the bonding sheet 5 is attached onto the strippable printing ink I, the metal dam structures 2 and the metal circuit pattern 4, and the bonding sheet 5 is trapped in the gap (the part not located in the printing area R) between the metal dam structures 2 and the metal circuit pattern 4, so as to be further attached onto the core substrate 1. Furthermore, the other side surface of the bonding sheet 5 is attached to the core board 6.

Furthermore, in the blind routing operation, two blind routing milling cutters F are respectively aligned with the positions of the two laser cut grooves 3 so as to blind route from the other side surface of the core substrate 1. Each of the blind routing milling cutters F blind routes from the other side surface of the core substrate 1 towards the laser cut groove 3, and a blind routing range of each of the blind routing milling cutters F partially overlaps with the laser cut groove 3 so as to remove part of the strippable printing ink I filled in the laser cut groove 3.

Furthermore, the blind routing depth for each of the blind routing milling cutters F is smaller than the thickness of the core substrate 1; that is, each of the blind routing milling cutters F does not penetrate through the core substrate 1 after the blind routing operation is finished.

Still referring to FIG. 5D, in the present embodiment, each of the blind routing milling cutters F does not align with the center line of the corresponding laser cut groove 3 for blind routing. Each of the blind routing milling cutters F performs blind routing at the position slightly deviated from the printing area R with regard to the center line of the corresponding laser cut groove 3, so as to facilitate the subsequent cover-opening operation. However, the present disclosure is not limited thereto.

Figure 5E:
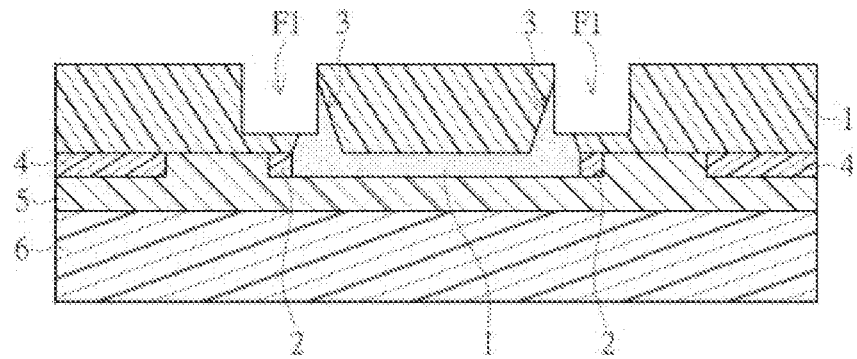
FIG. 5E is a schematic diagram of step S150 of the cover-opening method of the printed circuit board according to the embodiment of the present disclosure.

FIG. 5E is a schematic diagram of the step S150 of the cover-opening method of semi-flex printed circuit board according to the embodiment of the present disclosure. The step S150 includes: removing the two blind routing milling cutters F to form two blind routing openings F1 in the core substrate 1. More specifically, the two blind routing openings F1 are recessed from the other side surface of the core substrate 1 towards the two metal dam structures 2, respectively, and having a shape complementary to that of the blind routing milling cutter. The blind routing ranges of the two blind routing openings F1 partially overlap with the two laser cut grooves 3, respectively, so as to partially remove the strippable printing ink I filled in the laser cut grooves 3. Furthermore, the blind routing ranges of the two blind routing openings F1 do not cover the metal dam structures 2.

Figure 5F:
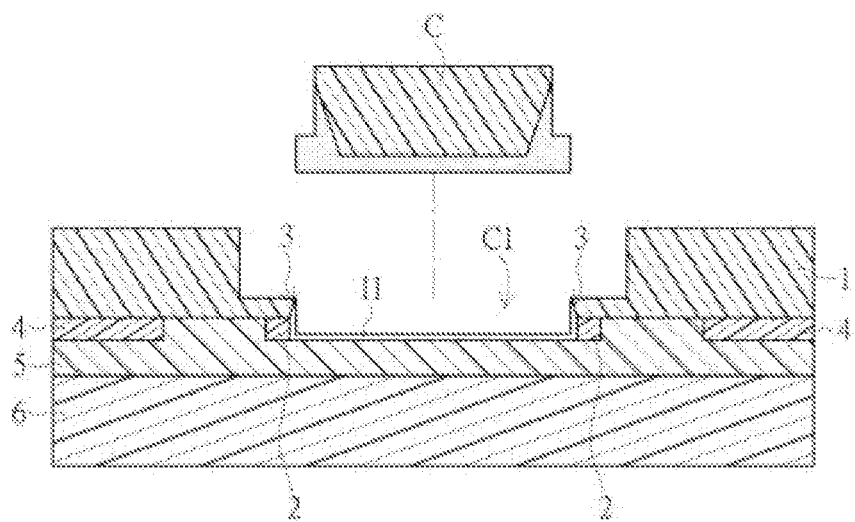
FIG. 5F is a schematic diagram of step S160 of the cover-opening method of the printed circuit board according to the embodiment of the present disclosure.

FIG. 5F is a schematic diagram of the step S160 of the cover-opening method of semi-flex printed circuit board according to the embodiment of the present disclosure. The step S160 includes: performing a cover-opening operation to remove a cover-opening structure C of the core substrate 1 located between the two blind routing openings F1, thereby forming a cover-opening opening C1.

In the cover-opening operation, the cover-opening structure C located between the two blind routing openings F1 is separated from the build-up board structure (including the bonding sheet 5 and the core board 6) from the positions of the two laser cut grooves 3. The cover-opening structure C is inverted Chinese character "凸"-shaped, with a wider top and a narrower bottom, but the present disclosure is not limited thereto.

More specifically, the cover-opening structure C includes a part of material of the core substrate 1 and a part of material of the strippable printing ink I, and the cover-opening structure C is separated from the build-up board structure from the positions of the two laser cut grooves 3 by the strippable printing ink I, thus forming a cover-opening opening C1 with a shape complementary to that of the cover-opening structure C.

After the cover-opening operation is completed, parts of the bottom of the cover-opening opening C1 that are located at the bonding sheet 5, the sidewalls of the metal dam structures 2 and the sidewalls of the laser cut grooves 3 have residual ink I1 left by the strippable printing ink I, which needs to be further removed by the following steps.

Figure 5G:
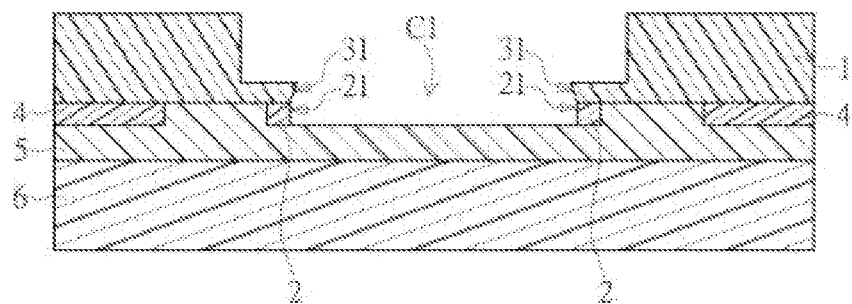
FIG. 5G is a schematic diagram of step S170 of the cover-opening method of the printed circuit board according to the embodiment of the present disclosure.

FIG. 5G is a schematic diagram of the step S170 of the cover-opening method of semi-flex printed circuit board according to the embodiment of the present disclosure. The step S170 includes: performing a cleaning operation to remove the residual ink I1 located at the bottom of the cover-opening opening C1.

In the cleaning operation, the residual ink I1 located at the bottom of the cover-opening opening C1 is cleaned and removed by using chemical agent. The chemical agent may be, for example, a chemical agent containing modified alcohol ether, but the present disclosure is not limited thereto.

Referring back to FIG. 2, the sidewall of each of the metal dam structures 2 facing the cover-opening opening C1 is defined as a metal dam sidewall 21, and the sidewall of each of the laser cut grooves 3 facing the cover-opening opening C1 is defined as a laser cutting sidewall 31. An included angle α is formed between the metal dam sidewall 21 and the laser cutting sidewall 31; the included angle α is preferably between 120 degrees and 150 degrees, and particularly preferably between 130 degrees and 140 degrees. For example, the included angle α may be 135 degrees.

Based on the included angle α between the metal dam sidewall 21 and the laser cutting sidewall 31, a flushing space can be formed between the metal dam sidewall 21 and the laser cutting sidewall 31. Therefore, the chemical agent can be sufficiently exchanged in the flushing space between the metal dam sidewall 21 and the laser cutting sidewall 31, so that the residual ink I1 located between the metal dam sidewall 21 and the laser cutting sidewall 31 can be sufficiently removed.

In the existing art, after the cover-opening operation in the manufacturing process of the circuit board, the strippable glue at the edge of the cover-opening opening may be mixed with the PP glue, and hence is difficult to be stripped off when cleaning. According to the cover-opening method of semi-flex printed circuit board provided by the embodiment of the present disclosure, the strippable printing ink I (i.e., the strippable glue) is no longer in contact with the edge of the bonding sheet 5 (i.e., the PP glue), and the blind routing opening F1 is directly abutted with the laser cut groove 3, so that the problem that the strippable glue is difficult to be stripped off can be solved.

In addition, in the existing art, an angle of the edge of the cover-opening opening is affected by laser, which results in liquid medicine exchange problem and a long time for stripping off the strippable glue; also, there is a risk that the strippable glue would be remained, which may affect the electrical characteristics of the finished circuit board. According to the cover-opening method of semi-flex printed circuit board provided by the embodiment of the present disclosure, the side edge of the strippable printing ink I (i.e., the strippable glue) is modified to be abutted with the metal dam structure 2 (i.e., the metal circuit), and the strippable printing ink I is relatively easier to be removed from the metal copper surface, thereby reducing the possibility of residue of the strippable printing ink I.

Furthermore, the cover-opening method of semi-flex printed circuit board according to the embodiment of the present disclosure can avoid the overflow of the strippable printing ink I in the printing process and assists in improving the stripping efficiency and clear-up effect to the strippable printing ink I in the subsequent stripping operation, by means of the design of the metal dam structure 2 and the laser cut groove 3. More specifically, the metal dam structures 2 can prevent the strippable printing ink I from overflowing during the printing process; the strippable printing ink I is filled in the laser cut grooves 3 during the printing process, which also assists in preventing the strippable printing ink I from overflowing from the positions of the metal dam structures 2. Moreover, the laser cut grooves 3 can assist in the subsequent stripping efficiency and clear-up effect to the strippable printing ink I.

The present disclosure is the beneficial in that, the semi-flex printed circuit board with cover-opening opening provided by the present disclosure can solve the problem that the strippable printing ink is difficult to be stripped off and can reduce the possibility of residue of the strippable printing ink, thereby improving the reliability of the printed circuit board, by adopting the technical solution of "a core substrate with an inner side surrounding an cover-opening opening, the cover-opening opening penetrating through an upper surface and a lower surface of the core substrate; two metal dam structures arranged on the lower surface of the core substrate at two opposite sides of the cover-opening opening respectively and surrounding the cover-opening opening together with the core substrate; a bonding sheet attached to the lower surface of the core substrate with the two metal dam structures provided thereon, a part of the bonding sheet being exposed to the cover-opening opening and surrounding the cover-opening opening together with the core substrate; and a core board arranged on a side surface of the bonding sheet away from the core substrate; wherein two sides of a bottom of the core substrate surrounding the cover-opening opening are provided with two laser cutting sidewalls respectively, and sidewalls of the two metal dam structures surrounding the cover-opening opening are connected with the two laser cutting sidewalls respectively and each defined as metal dam sidewall; wherein in relation to each of the metal dam sidewalls and the laser cutting sidewall connected thereto, an included angle between the metal dam sidewall and the laser cutting sidewall is 120 degrees to 150 degrees".

The above disclosure is only a preferred and feasible embodiment of the present disclosure without limiting the claims of the present disclosure. Therefore, all equivalent technical changes made by using the contents of the present specification and drawings are included in the claims of the present disclosure.

What is claimed is:

1. A semi-flex printed circuit board with cover-opening opening, comprising:
   a core substrate with an inner side surrounding a cover-opening opening, the cover-opening opening penetrating through an upper surface and a lower surface of the core substrate;
   two metal dam structures arranged on the lower surface of the core substrate at two opposite sides of the cover-opening opening respectively and surrounding the cover-opening opening together with the core substrate;
   a bonding sheet attached to the lower surface of the core substrate with the two metal dam structures provided thereon, a part of the bonding sheet being exposed to the cover-opening opening and surrounding the cover-opening opening together with the core substrate; and
   a core board arranged on a side surface of the bonding sheet away from the core substrate,
   wherein two sides of a bottom of the core substrate surrounding the cover-opening opening are provided with two laser cutting sidewalls respectively, and sidewalls of the two metal dam structures surrounding the cover-opening opening are connected with the two laser cutting sidewalls respectively and each defined as metal dam sidewall, and wherein in relation to each of the metal dam sidewalls and the laser cutting sidewall connected thereto, an included angle between the metal dam sidewall and the laser cutting sidewall is 120 degrees to 150 degrees,
   wherein a side surface of the bonding sheet facing to the core substrate is attached to the two metal dam structures on the core substrate with a portion of the bonding sheet further filled in a gap at inner sides of the two metal dam structures so as to be attached to the lower surface of the core substrate, and the side surface of the bonding sheet away from the core substrate is attached to the core board so as to attach the core substrate with the core board.

2. The semi-flex printed circuit board with cover-opening opening as claimed in claim 1, wherein the included angle is between 130 degrees and 140 degrees.

3. The semi-flex printed circuit board with cover-opening opening as claimed in claim 1, wherein an area with the included angle between the metal dam sidewall and the laser cutting sidewall is defined as a flushing space in which chemical liquid is provided for flushing in a cover-opening operation so that no residual glue of a strippable printing ink remains in the flushing space.

4. The semi-flex printed circuit board with cover-opening opening as claimed in claim 1, wherein each of the two metal dam structures has a substantially rectangular or trapezoidal shape, and each of the two metal dam structures has a width between 30 microns and 600 microns and a height between 15 microns and 300 microns.

5. The semi-flex printed circuit board with cover-opening opening as claimed in claim 1, wherein the cover-opening opening is substantially in a shape with wider top and narrower bottom, and two metal dam sidewalls and two laser cutting sidewalls jointly define a narrower part of the cover-opening opening.

6. The semi-flex printed circuit board with cover-opening opening as claimed in claim 1, wherein a section of the semi-flex printed circuit board located at the cover-opening opening is defined as a semi-flex section, and the semi-flex printed circuit board can be bent from the semi-flex section.

7. The semi-flex printed circuit board with cover-opening opening as claimed in claim 1, wherein the semi-flex printed circuit board further comprises an electronic component embedded in the cover-opening opening, and the electronic component is a resistor or a capacitor.

8. The semi-flex printed circuit board with cover-opening opening as claimed in claim 1, wherein the metal dam sidewalls of the two metal dam structures face towards the cover-opening opening without attached with the bonding sheet, and the metal dam sidewalls of the two metal dam structures are substantially perpendicular to the bonding sheet.

9. The semi-flex printed circuit board with cover-opening opening as claimed in claim 1, wherein the two metal dam structures are formed by a metal etching operation, and the two laser cutting sidewalls are formed by a laser cutting operation.

* * * * *